US012148641B2

(12) United States Patent  
Son et al.

(10) Patent No.: US 12,148,641 B2
(45) Date of Patent: Nov. 19, 2024

(54) CONTAINER AND SUBSTRATE TREATING APPARATUS

(71) Applicant: SEMES CO., LTD., Chungcheongnam-do (KR)

(72) Inventors: Dukhyun Son, Cheonan-si (KR); Byung Kyu Kim, Seoul (KR)

(73) Assignee: SEMES CO., LTD., Chungcheongnam-do (KR)

(*) Notice: Subject to any disclaimer, the term of this patent is extended or adjusted under 35 U.S.C. 154(b) by 148 days.

(21) Appl. No.: 17/396,267

(22) Filed: Aug. 6, 2021

(65) Prior Publication Data

US 2022/0044951 A1 Feb. 10, 2022

(30) Foreign Application Priority Data

Aug. 7, 2020 (KR) .................. 10-2020-0098949

(51) Int. Cl.
H01L 21/673 (2006.01)
H01L 21/677 (2006.01)

(52) U.S. Cl.
CPC .. H01L 21/67383 (2013.01); H01L 21/67736 (2013.01)

(58) Field of Classification Search
CPC ............... H01L 21/67383; H01L 21/67736
See application file for complete search history.

(56) References Cited

U.S. PATENT DOCUMENTS

| 2004/0081547 | A1* | 4/2004 | Suh ..................... H01L 21/6732 414/811 |
| 2015/0332950 | A1* | 11/2015 | Mazzocco ............ H01L 21/683 901/30 |
| 2017/0117170 | A1* | 4/2017 | Wong ................ H01L 21/67167 |
| 2019/0243257 | A1* | 8/2019 | Guan .................. G03F 7/70716 |
| 2022/0246408 | A1* | 8/2022 | Genetti ............. H01L 21/67346 |
| 2022/0367155 | A1* | 11/2022 | Jung ................. H01J 37/32642 |
| 2022/0384147 | A1* | 12/2022 | Lee .................. H01J 37/32027 |
| 2022/0384160 | A1* | 12/2022 | Lee .................. H01L 21/68742 |

FOREIGN PATENT DOCUMENTS

| JP | 2017-098540 A | 6/2017 |
| KR | 101155882 B1 | 7/2012 |
| KR | 1020170054253 A | 5/2017 |
| KR | 1020200014906 A | 2/2020 |
| KR | 10-2022-0018014 A | 2/2022 |

* cited by examiner

Primary Examiner — Saul Rodriguez
Assistant Examiner — Brendan P Tighe
(74) Attorney, Agent, or Firm — Li & Cai Intellectual Property (USA) Office

(57) ABSTRACT

Disclosed is a container. The container includes a housing having an interior space, and a support part that supports an expendable component in the interior space, and the support part includes an alignment pin that aligns the expendable component.

18 Claims, 19 Drawing Sheets

CONTAINER AND SUBSTRATE TREATING APPARATUS

CROSS-REFERENCE TO RELATED APPLICATIONS

A claim for priority under 35 U.S.C. § 119 is made to Korean Patent Application No. 10-2020-0098949 filed on Aug. 7, 2020, in the Korean Intellectual Property Office, the entire contents of which are hereby incorporated by reference.

BACKGROUND

Embodiments of the inventive concept described herein relate to a container and a substrate treating apparatus.

Plasma refers to an ionized gaseous state including ions, radicals, and electrons. The plasma is generated by very high temperature, strong electric fields, or radio frequency (RF) electromagnetic fields. A semiconductor device manufacturing process may include an etching process of removing a thin film formed on a substrate, such as a wafer, by using plasma. The etching process is performed as ions and/or radicals contained in plasma collide a thin film on a substrate or react with a thin film.

A substrate treating apparatus using plasma includes a process chamber of a vacuum atmosphere, a support chuck that supports a substrate in the process chamber, and a focusing ring that surrounds an outer periphery of the substrate seated on the support chuck. The focusing ring is installed to distribute plasma with a high uniformity, and is etched together with the substrate with plasma. When the substrate is repeatedly etched, the focusing ring also is etched so that the shape of the focusing ring gradually changes. A direction, in which ions and/or radicals are input to the substrate, is changed according to a change in the shape of the focusing ring and thus the etching characteristics of the substrate is changed. Accordingly, when a specific number or more of substrates are etched or the shape of the focusing ring is changed to deviate from an allowable range, it is necessary to replace the focusing ring.

In order to replace the focusing ring, a transfer robot carries out the used focusing ring from a process chamber and carries the focusing ring into a ring pod, and thereafter, carries out a new focusing ring from the ring pod and carries the focusing ring into the process chamber. Then, in order to allow the transfer robot to appropriately seat the new focusing ring at a desired location in the process chamber, it is necessary to raise the new focusing ring at a precise location when the new focusing ring is carried out from the ring pod. That is, when the location of the new focusing ring received in the ring pod is not precise, the location, at which the new focusing ring is seated in the process chamber, deviates from a proper location. Accordingly, in order to appropriately seat the new focusing ring at the desired location in the process chamber, first, it is necessary to appropriately align the location of the focusing ring in the ring pod.

However, after opening the ring pod, an operator directly carries the new focusing ring received in the ring pod into the opened ring pod. Accordingly, the location of the new focusing ring received in the ring pod may be changed according to the skill of the operator. Furthermore, in a process of transferring the ring pod by an overhead transport apparatus, the location of the new focusing ring received in the ring pod may be changed. That is, the new focusing ring received in the ring pod may not be appropriately aligned or the new focusing ring may not be appropriately seated in the process chamber as the location of the focusing ring is changed in a process of feeding the container even when the focusing ring is appropriately aligned. This makes it difficult to precisely control the etching characteristics of the substrate.

SUMMARY

Embodiments of the inventive concept provide a container that may align a location of an expendable component received in the container, and a substrate treating apparatus.

Embodiments of the inventive concept also provide a container that may minimize a location of an expendable component received in the container from being changed in a process of transferring the container, and a substrate treating apparatus.

Embodiments of the inventive concept also provide a container that may align a location of a sensor received in the container, and a substrate treating apparatus.

Embodiments of the inventive concept also provide a container that may allow an expendable component to be seated at a proper location in a process chamber when the expendable component received in the container is transferred to the process chamber, and a substrate treating apparatus.

Embodiments of the inventive concept also provide a container that may allow a sensor to be seated at a proper location in a process chamber when the sensor received in the container is transferred to the process chamber, and a substrate treating apparatus.

Embodiments of the inventive concept also provide a container that may minimize impurities attached to a used expendable component from being delivered to an unused expendable component, and a substrate treating apparatus.

Embodiments of the inventive concept also provide a container that may align locations of expendable components of various sizes, and a substrate treating apparatus.

The aspect of the inventive concept is not limited thereto, and other unmentioned aspects of the present invention may be clearly appreciated by those skilled in the art from the following descriptions.

The inventive concept provides a container. The container includes a housing having an interior space, and a support part that supports an expendable component in the interior space, and the support part includes an alignment pin that aligns the expendable component.

According to an embodiment, the support part may further include at least one support slot, and an alignment block installed in the support slot to be detachable, and having the alignment pin.

According to an embodiment, the support part may further include at least one guide pin that guides a location of the alignment block inserted into the support slot.

According to an embodiment, the alignment block may have a protrusion or a guide groove that guides insertion of the alignment block at at least any one of surfaces, which contacts the support slot.

According to an embodiment, at least one of surfaces of the support slot, which contacts the alignment block, may have a shape corresponding to the protrusion or the guide groove.

According to an embodiment, any one selected from a first alignment block, and a second alignment block, of which a location of the alignment pin is different from that of the first alignment block, may be installed in the support slot.

According to an embodiment, the alignment pin may be inserted into a groove formed in the expendable component.

According to an embodiment, the expendable component may have a ring shape.

According to an embodiment, the support part may support a substrate type sensor having a notch, in the interior space, and the container may further include a notch aligning member inserted into the notch and that aligns the sensor.

According to an embodiment, the container may further include a partition plate that partitions the interior space into a space, in which an unused expendable component is received, and a space, in which a used expendable component is received.

The inventive concept provides a substrate treating apparatus. The substrate treating apparatus includes a process chamber that performs a treatment process, a load pot that receives the expendable component of the process chamber and in which a container having an interior space is seated, and a transfer robot that transfers the expendable component between the process chamber and the container, and the container includes a support part having a plurality of support slots that support the expendable component, and an alignment block detachably mounted on the support slot and provided with an alignment pin inserted into a groove formed in the expendable component.

According to an embodiment, the substrate treating apparatus may further include a controller, and the controller may control the transfer robot such that the transfer robot transfers the expendable component used in the process chamber to the interior space and transfers an unused expendable component in the interior space to the process chamber.

According to an embodiment, the controller may control the transfer robot such that a transfer speed of the expendable component is lower than a transfer speed of a substrate.

According to an embodiment, the substrate treating apparatus may further include a partition plate that partitions the interior space into a space, in which an unused expendable component is received, and a space, in which a used expendable component is received.

According to an embodiment, the alignment block may be installed in the support slot of the space, in which the unused expendable component is received.

According to an embodiment, the substrate treating apparatus may further include a groove, into which the alignment pin is inserted, is formed on a bottom surface of the expendable component.

The inventive concept provides a substrate treating apparatus. The substrate treating apparatus includes a process chamber that treats a substrate by using plasma, a load pot, in which a container that receives a focusing ring provided in the process chamber is seated, and a transfer robot that transfers the focusing ring between the process chamber and the container, and the container includes a support part having a plurality of support slots that support the focusing ring, and an alignment block detachably mounted on the support slot and provided with an alignment pin inserted into a groove formed in the focusing ring.

According to an embodiment, the support part may include a plurality of guide pins that guides a location of the alignment block inserted into the support slot, and the alignment block may have a protrusion or a guide groove that guides insertion of the alignment block into at least any one of surfaces, which contacts the support slot.

According to an embodiment, the container may further include a notch aligning member inserted into a notch formed in a substrate type sensor received in the container, and that aligns the substrate type sensor.

According to an embodiment, the substrate treating apparatus may further include a controller, and the controller may control the transfer robot such that the transfer robot transfers the focusing ring that has been used in the process chamber to the container, and transfers the used focusing ring that is transferred to the container to a location below an unused focusing ring seated in the container.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
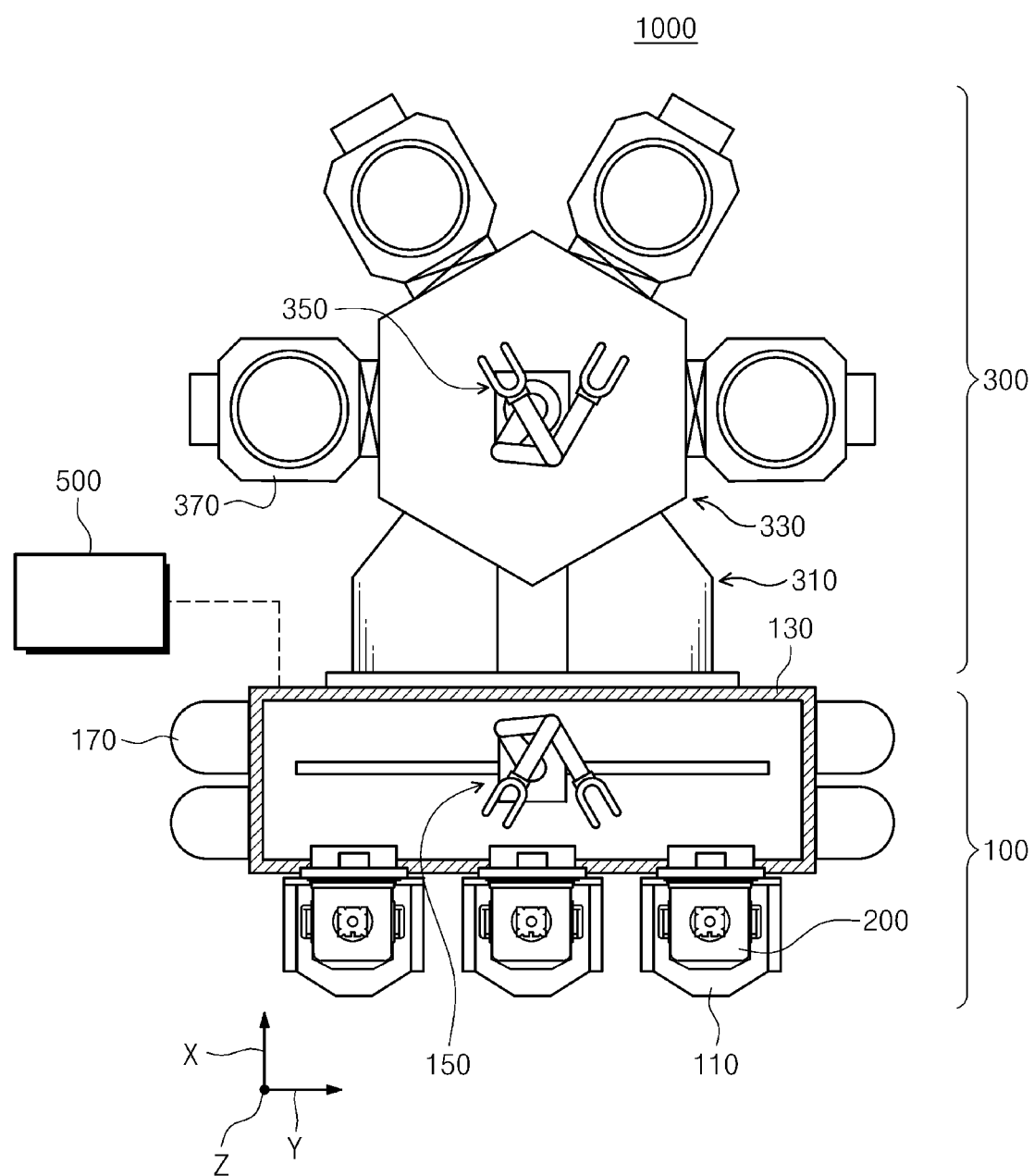
FIG. 1 is a plan view schematically illustrating a substrate treating apparatus according to an embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

Hereinafter, embodiments of the inventive concept will be described with reference to FIGS. 1 to 16.

FIG. 1 is a plan view schematically illustrating a substrate treating apparatus according to an embodiment of the inventive concept. Referring to FIG. 1, a substrate treating apparatus 1000 according to an embodiment of the inventive concept may include an index unit 100, a process executing unit 300, and a controller 500. The index unit 100 and the process executing unit 300 may be arranged along a first direction "X" when viewed from a top. Hereinafter, a direction that is perpendicular to the first direction "X" when viewed from the top is defined as a second direction "Y". Furthermore, a direction that is perpendicular to the first direction "X" and the second direction "Y" is defined as a third direction "Z". Here, the third direction "Z" may refer to a direction that is perpendicular to a ground surface.

The index unit 100 may include a load pot 110, an index chamber 130, a first transfer robot 150, and a side buffer 170.

A container 200 may be seated in the load pot 110. A portion of the container 200 seated in the load pot 110 may receive a substrate (for example, a wafer) that is transferred to the process executing unit 300.

Furthermore, another portion of the container 200 seated in the load pot 110 may receive an expendable component "R" and/or a sensor WS that is transferred to the process executing unit 300. Furthermore, another portion of the container 200 seated in the load pot 110 may receive a carrier "C" that transfers the expendable component "R". The container 200 may be transferred to the load pot 110 by a container transfer apparatus to be loaded in the load pot 110 or unloaded from the load pot 110, and may be transferred. The container transfer apparatus may be an overhead transport apparatus (hereinafter, an OHT), but the inventive concept is not limited thereto and the container 200 may be transferred by various apparatuses that transfer the container 200. Furthermore, an operator may directly load the container 200 in the load pot 110 or unload the container 200 seated in the load pot 110 from the load pot 110.

The index chamber 130 may be provided between the load pot 110 and the process executing unit 300. The index chamber 130 may be maintained in an atmospheric atmosphere. The side buffer 170 that is a keeping site may be installed on one side of the index chamber 130. Furthermore, an alignment unit that aligns the substrate, the expendable component "R", and/or the sensor WS may be provided at a portion of the side buffer 170.

Furthermore, the first transfer robot 150 may be provided in the index chamber 130. The first transfer robot 150 may transfer the substrate, the expendable component "R", and the sensor WS between the container 200 seated in the load pot 110, a load lock chamber 310, which will be described below, and the side buffer 170.

The process executing unit 300 may include the load lock chamber 310, a transfer chamber 330, a second transfer robot 350, and a process chamber 370.

The load lock chamber 310 may be disposed between the transfer chamber 330 and the index chamber 130. The load lock chamber 310 provides a space, in which the substrate, the expendable component "R", and the sensor WS are temporarily stored. A vacuum pump (not illustrated) and a valve may be installed in the load lock chamber 310 such that an internal atmosphere of the load lock chamber 310 may be converted between an air atmosphere and a vacuum atmosphere. Because the internal atmosphere of the transfer chamber 330, which will be described below, is maintained in the vacuum atmosphere, the atmosphere of the load lock chamber 310 may be converted between the air atmosphere and the vacuum atmosphere to transfer the substrate, the expendable component "R", and the sensor WS between the transfer chamber 330 and the index chamber 130.

The transfer chamber 330 may be disposed between the load lock chamber 310 and the process chamber 370. As described above, the internal atmosphere of the transfer chamber 330 may be maintained in the vacuum atmosphere. Furthermore, the second transfer robot 350 may be provided in the transfer chamber 330. The second transfer robot 350 may transfer the substrate, the expendable component "R", and the sensor WS between the load lock chamber 310 and the process chamber 370.

At least one process chamber 370 may be connected to the transfer chamber 330. The process chamber 370 may be a chamber that performs a process on the substrate. The process chamber 370 may be a liquid treating chamber that treats the substrate by supplying a treatment liquid to the substrate. Furthermore, the process chamber 370 may be a plasma chamber that treats the substrate by using plasma. Furthermore, some of the process chambers 370 may be liquid treatment chambers that treat the substrate by supplying a treatment liquid to the substrate, and some of the process chambers 370 may be plasma chambers that treat the substrate by using plasma. However, the inventive concept is not limited thereto, and a substrate treating process performed in the process chamber 370 may be variously modified to known substrate treating processes. Furthermore, when the process chamber 370 is a plasma chamber that treats the substrate by using the plasma, the plasma chamber may be a chamber that performs an etching or ashing process of removing a thin film on the substrate by using the plasma. However, the inventive concept is not limited thereto, and a plasma treatment process performed in the process chamber 370 may be variously modified to known plasma treatment processes.

Furthermore, FIG. 1 illustrates as an example that the transfer chamber 330 has a substantially hexagonal shape when viewed from the top, and four process chambers 370 connected to the transfer chamber 330 are provided, but the inventive concept is not limited thereto. For example, the shape of the transfer chamber 330 and the number of the process chambers 370 may be variously modified according to the necessity of the user, and the number of substrates that requires a treatment.

Hereinafter, the container 200 according to the embodiment of the inventive concept will be described in detail. In detail, among the containers 200, the container 200 that receives the expendable component "R" and/or the sensor WS will be described in detail below. The container 200 may receive an unused expendable component "R". Accordingly, when it is necessary to replace the expendable component "R" of the process chamber 370, the unused expendable component "R" received in the container 200 may be transferred to the process chamber 370. Furthermore, the expendable component "R" used in the process chamber 370 may be carried into the container 200.

Figure 2:
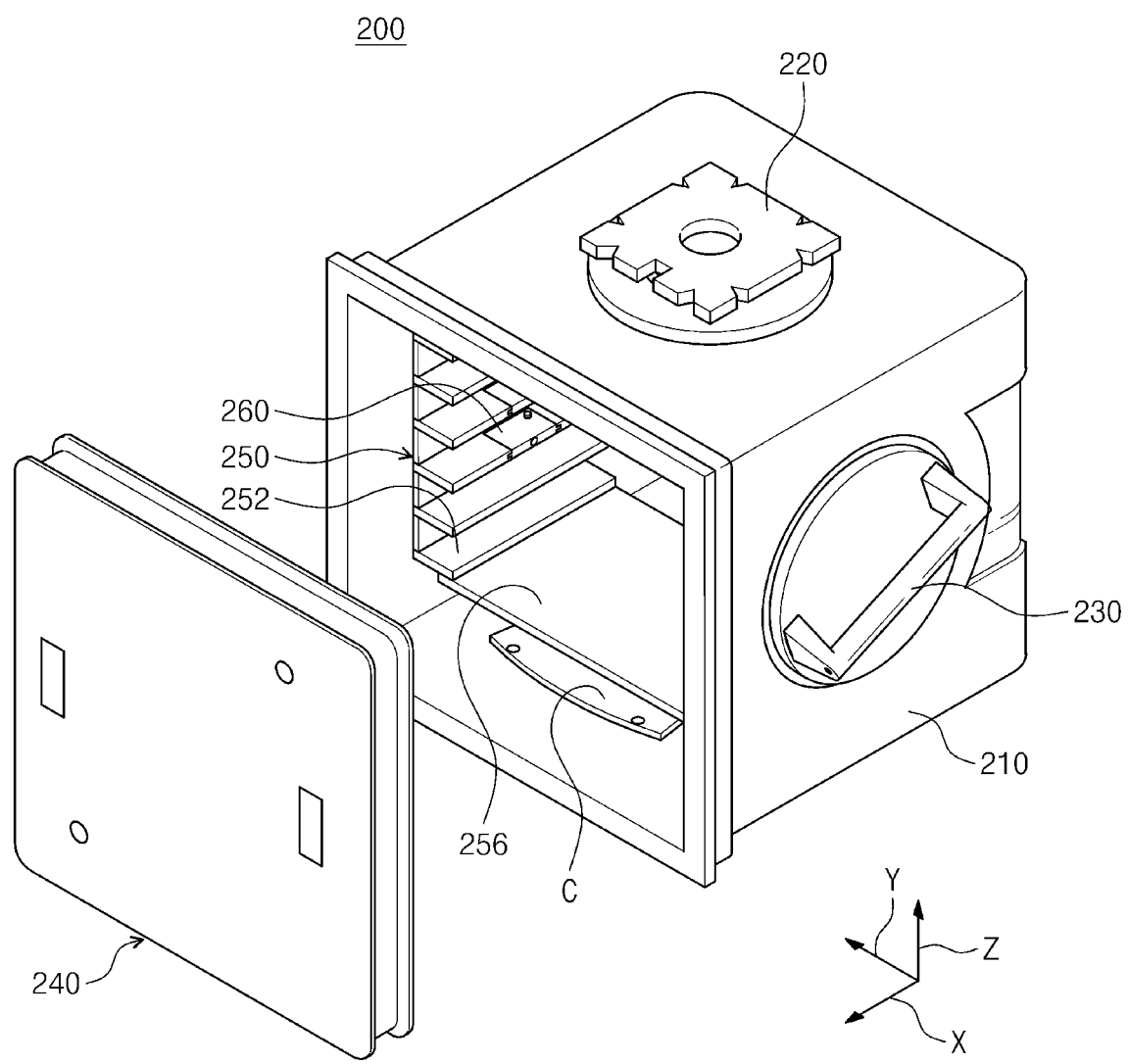
FIG. 2 is a view illustrating a container of FIG. 1.

FIG. 2 is a view illustrating the container of FIG. 1. Referring to FIG. 2, the container 200 may include a housing 210, a flange 220, a grip part 230, a door 240, a support part 250, a carrier support structure 270, and a notch aligning member 280.

The housing 210 may have an interior space. At least one of the expendable component "R", the sensor WS, and the carrier "C" may be received in the interior space of the housing 210. The flange 220 may be installed on an upper surface of the housing 210. The flange 220 may be gripped by a gripper of a container transfer apparatus, for example, an overhead transfer (OHT) apparatus.

Furthermore, the grip part 230 may be installed on a side surface of the housing 210. The grip part 230 may be installed on opposite side surfaces of the housing 210. The grip part 230 may be a handle that allows the operator to grip the container 200. Accordingly, the operator may grip the grip part 230 to directly seat the container 200 in the load pot 110 or separate the container 200 from the load pot 110.

Figure 3:
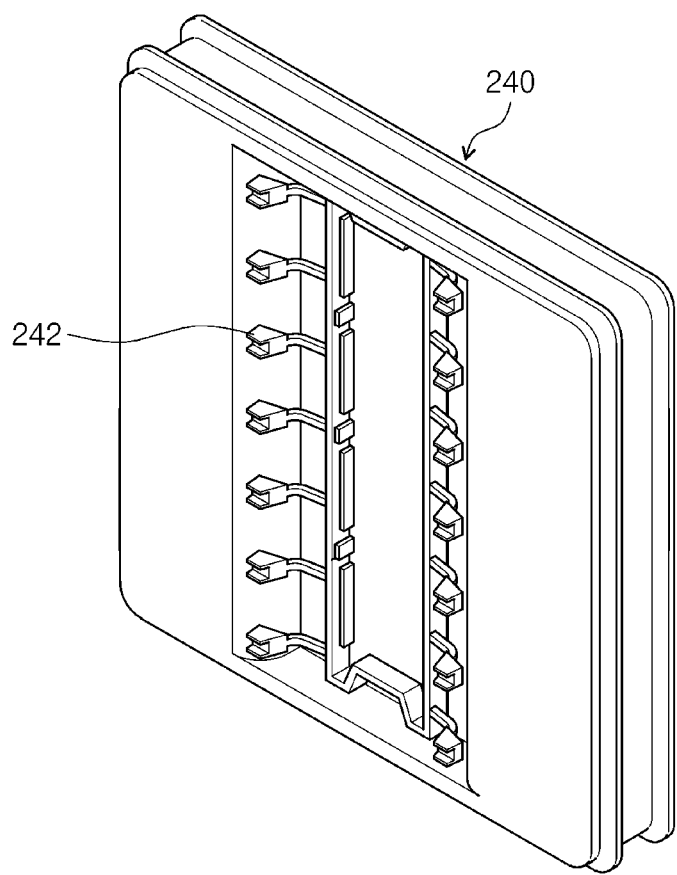
FIG. 3 is a view illustrating a door of FIG. 2.

The door 240 may selectively open and close the interior space of the housing 210. The door 240 may be combined with the housing 210 to form the interior space. The door 240 may be docked with a front surface of the housing 210 or undocked from the front surface of the housing 210. One surface of the door 240, which faces the interior space of the housing 210, as illustrated in FIG. 3, may be provided with a retainer 242 that clamps the expendable component "R" and/or the sensor WS received in the interior space. The retainer 242 may have a structure that extends along an upward/downward direction. The retainer 242 may clamp a side of the expendable component "R" and/or the sensor WS received in the interior space, and may restrict a change of a location of the expendable component "R" and/or the sensor WS received in the interior space.

Referring to FIG. 2 again, the support part 250 may be provided in the interior space of the housing 210. The support part 250 may support the expendable component "R" and/or the sensor WS in the interior space of the housing 210. The support part 250 may include a support slot 252, a separation plate 256, and an alignment block 260.

The support slot 252 may have a bar shape. The support slot 252 may support the expendable component "R" and/or the sensor WS. The support slot 252 may support a bottom surface of an edge area of the expendable component "R" and/or the sensor WS. For example, the support slot 252 may support at least a portion of the bottom surface of the edge area of the expendable component "R" and/or the sensor WS. Furthermore, the support slot 252 may support one side and an opposite side of the bottom surface of the edge area of the expendable component "R" and/or the sensor WS.

At least one support slot 252 may be provided. For example, a plurality of support slots 252 may be provided. Furthermore, the support slots 252 may be arranged along the third direction "Z" that is the upward/downward direction. Accordingly, the expendable components "R" and/or the sensors WS supported by the support slots 252 may be received in the interior space of the housing 210 along the upward/downward direction.

The separation plate 256 may partition the interior space of the housing 210. For example, the separation plate 256 may separate the interior space of the housing 210 into a space, in which the carrier "C" is received, and a space, in which the expendable component "R" and/or the sensor WS is received. The separation plate 256 may be coupled to, among the support slots 252, the support slot 252 installed on the lowermost side. For example, the separation plate 256 may be coupled to a lower surface of, among the support slots 252, the support slot 252 installed on the lowermost side. The separation plate 256 may separate the interior space of the housing 210 into the space, in which the carrier "C" is received, and the space, in which the expendable component "R" and/or the sensor WS is received, to minimize a danger of the carrier "C" and the hand of the first transfer robot 150 colliding with each other when the hand of the first transfer robot 150 is carried into the interior space of the housing 210. Furthermore, the separation plate 256 may minimize impurities attached to the expendable component "R" from being delivered to the carrier "C" when the used expendable component "R" is carried into the interior space of the housing 210.

Figure 4:
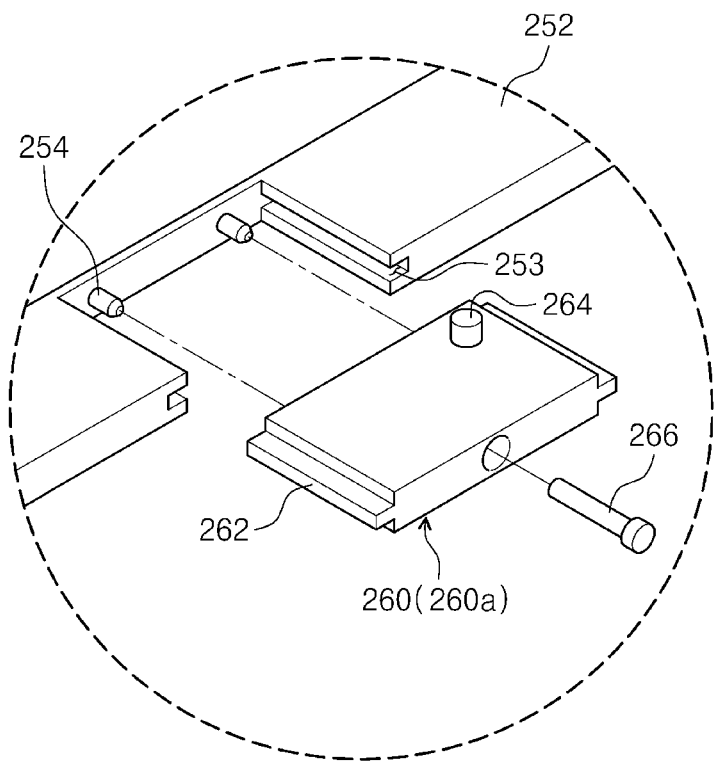
FIG. 4 is a view illustrating an example of a support slot and an alignment block of FIG. 2.

FIG. 4 is a view illustrating an example of a support slot and an alignment block of FIG. 2. Referring to FIG. 4, the alignment block 260 may be installed in the support slot to be detachable. The alignment block 260 may be inserted into the support slot 252. The alignment block 260 inserted into the support slot 252 may be fixedly coupled by a coupling unit 266.

At least one of the surfaces of the alignment block 260, which contacts the support slot 252, may be provided with a protrusion 262 that guides insertion of the alignment block 260. For example, the protrusions 262 may be formed on left and right surfaces of the alignment block 260 with respect to a direction, in which the alignment block 260 is inserted. Furthermore, at least one of the surfaces of the support slot 252, which contacts the alignment block 260, may be provided with a guide groove 253 having a shape corresponding to the protrusion 262. For example, the guide groove 253 may be formed at a location corresponding to the protrusion 262 of the alignment block 260 inserted into the support slot 252.

Furthermore, it has been described in the above example that the protrusion 262 is formed in the alignment block 260 and the guide groove 253 is formed in the support slot 252, but the inventive concept is not limited thereto and, unlike this, the guide groove may be formed in the alignment block 260 and the protrusion may be formed in the support slot 252.

Furthermore, the support part 250 may include at least one guide pin 254 that guides a location of the alignment block 260 inserted into the support slot 252. For example, the guide pin 254 may be provided at least one of the surfaces of the support slot 252, which contacts the alignment block 260. The guide pin 254 may be inserted into a hole (not illustrated) formed in the alignment block 260. For example, the hole, into which the guide pin 254 is inserted, may be formed on a front surface of the alignment block 260 with respect to the direction, in which the alignment block 260 is inserted into the support slot 252. Further, the guide pin 254 may be provided at a location corresponding to the hole formed in the alignment block 260. The guide groove 253, the guide pin 254, the protrusion 262, and the hole (not illustrated) may help the alignment block 260 be appropriately inserted into the support slot 252, and may prevent the location of the inserted alignment block 260 from being changed and the alignment block 260 from being loosened from the support slot 252.

The alignment block 260 may be provided with an alignment pin 264. The alignment pin 264 may be provided on an upper surface of the alignment block 260. Accordingly, when the alignment block 260 is inserted into the support slot 252, the support slot 252 may align the location of the supported expendable component "R".

Figure 5:
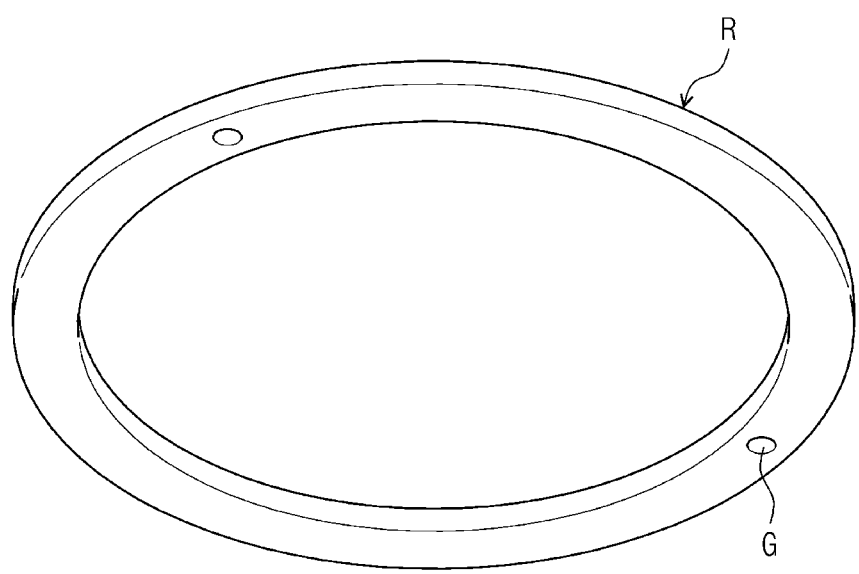
FIG. 5 is a view illustrating an expendable component seated on a support part of FIG. 2.
Figure 6:
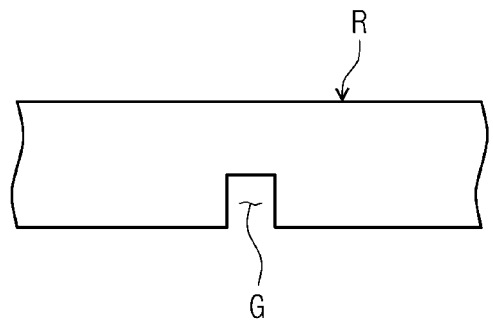
FIG. 6 is a cross-sectional view of the expendable component of FIG. 5, taken along line A-A' of FIG. 5.

For example, FIG. 5 is a view illustrating an expendable component seated on a support part of FIG. 2. FIG. 6 is a cross-sectional view of the expendable component of FIG. 5, taken along line A-A' of FIG. 5. Referring to FIGS. 5 and 6, the expendable component "R" may have a ring shape. The expendable component "R" may be a process kit provided in the process chamber 370. For example, the expendable component "R" may be a ring member provided in the process chamber 370. For example, the expendable component "R" may be an ISO ring or a focusing ring. An alignment groove "G" may be formed on a lower surface of the expendable component "R". A plurality of alignment grooves "G" may be formed on a lower surface of the expendable component "R". The alignment pin 264 provided in the alignment block 260 may be inserted into the alignment groove "G" to align the location of the expendable component "R".

That is, the alignment pin 264 according to the embodiment of the inventive concept may be inserted into the alignment groove "G" formed in the expendable component "R" received in the container 200 to align the expendable component "R". Accordingly, even when the skill of the operator is rather low, the expendable component "R" may be aligned at an appropriate location even only by causing the locations of the alignment groove "G" of the expendable component "R" and the alignment pin 264 to coincide with each other when the expendable component "R" is seated in the container 200. Accordingly, the expendable component "R" is not aligned in the container 200, and thus the expendable component "R" transferred to the process chamber 370 may not be appropriately seated at a proper location in the process chamber 370. Furthermore, the alignment pin 264 may be inserted into the alignment groove "G" formed in the expendable component "R" to restrict a change in the location of the expendable component "R" when the container 200 is transferred. Accordingly, a problem in which the location of the expendable component "R" is changed and thus the expendable component "R" may not be appropriately seated at a proper location in the process chamber 370 in a process of transferring the container 200 may be solved.

Figure 7:
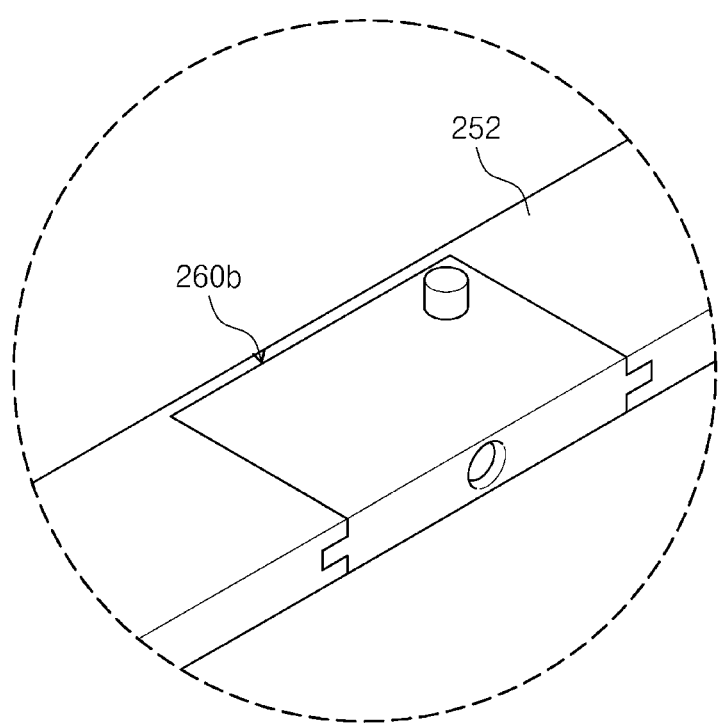
FIGS. 7 and 8 are views illustrating other examples of the alignment block installed in the support slot.
Figure 8:
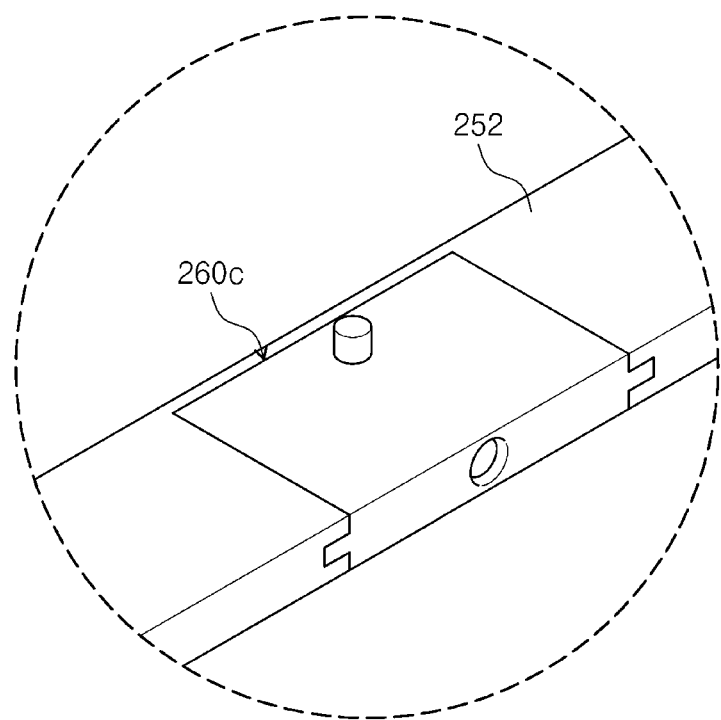

Furthermore, a plurality kinds of alignment blocks 260 may be provided. The locations of the alignment pins 264 provided to the plurality of kinds of alignment blocks 260, respectively, may be different. With the assumption that the alignment block 260 illustrated in FIG. 4 is a first alignment block 260a, any one of the alignment blocks 260, of which the location of the alignment pin 264 is different from the first alignment block 260a, may be installed in the support slot 252 of the container 200. For example, as illustrated in FIGS. 7 and 8, a second alignment block 260b or a third alignment block 260c, of which the location of the alignment pin is different from that of the first alignment block 260a, may be installed in the support slot 252.

The kinds of the expendable components "R" provided to the process chamber 370 may be different according to a treatment condition (for example, the etching condition) required by the substrate. For example, the shapes and/or sizes of the expendable components "R" may be different according to the treatment condition. Furthermore, the locations of the alignment grooves "G" formed on bottom surfaces of the expendable components "R" may be different kinds of the expendable components "R". This is because the shapes and/or the sizes of the expendable components "R" may be different from each other.

According to the embodiment of the inventive concept, the alignment block 260 may be provided in the support slot 252 to be detachable. Furthermore, according to the embodiment of the inventive concept, various kinds of alignment blocks 260, of which the locations of the alignment pins are different, may be provided. Furthermore, the user may select one or more of the various kinds of alignment blocks 260 according to the kind of the expendable component "R" provided to the process chamber 370, and may install the selected alignment block 260 in the support slot 252. That is, according to the inventive concept, a reception compatibility for the expendable component "R" of the container 200 may be further secured by changing the kind of the alignment block 260 installed in the support slot 252.

Figure 9:
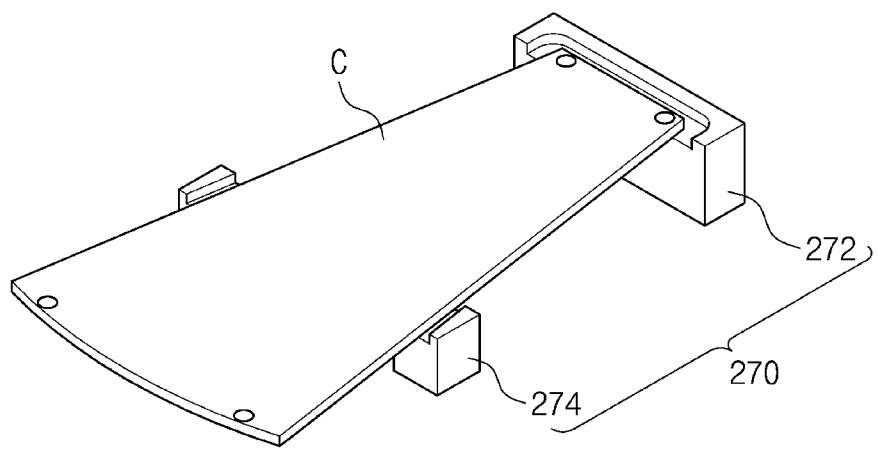
FIG. 9 is a view illustrating a state of a carrier seated in a container of FIG. 2, and a carrier support structure that supports the carrier.

FIG. 9 is a view illustrating a state of a carrier seated in a container of FIG. 2, and a seating part, in which the carrier is seated. Referring to FIG. 9, the carrier "C" may be used to transfer the expendable component "R". The carrier "C" may have a substantially ladder shape when viewed from the top, and any one of the surfaces of the carrier "C" may be rounded. The carrier "C" may be stored in the interior space of the container 200 by the carrier support structure 270. Further, the carrier "C" may be retrieved by the first transfer robot 150 having the hand.

The carrier support structure 270 may support the carrier "C". The carrier support structure 270 may support the carrier "C" in the interior space of the housing 210. The carrier support structure 270 may be disposed below the support part 250. The carrier support structure 270 may be installed in an interior space corresponding to the lower one of the interior spaces partitioned by the separation plate 256. The carrier support structure 270 may include a first support structure 272 and a second support structure 274. A pair of second support structures 274 may be provided. The first support structure 272 and the pair of second support structures 274 may support a lower surface of the carrier "C" at three points.

Figure 10:
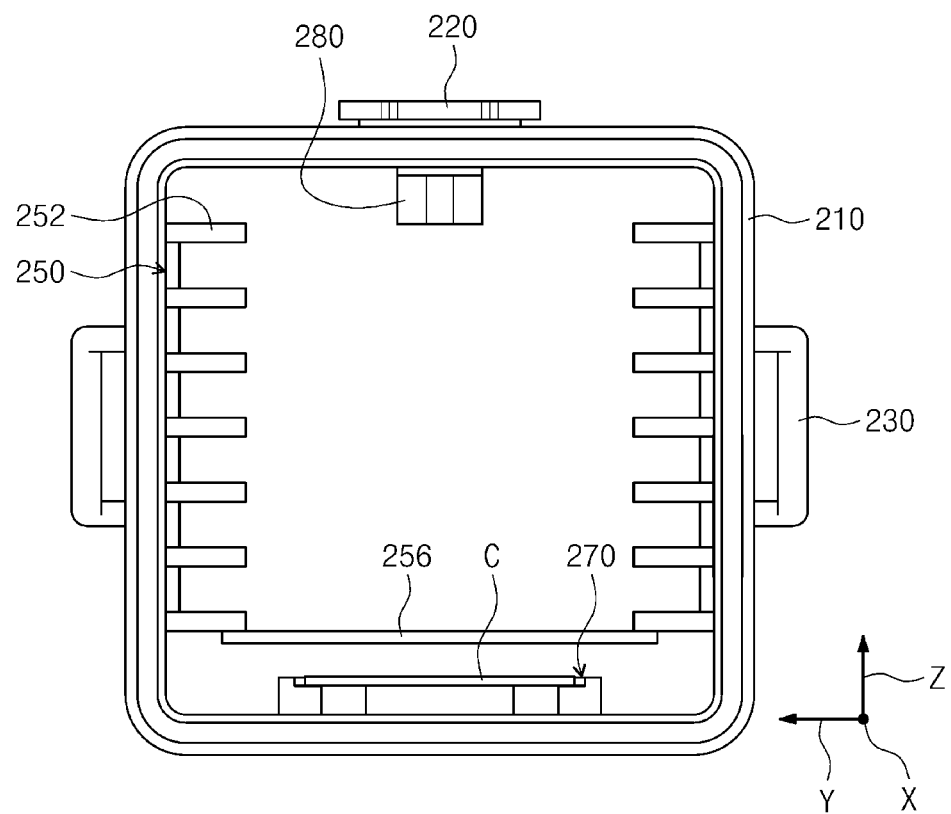
FIG. 10 is a front view of the container of FIG. 2 having an opened interior space.

FIG. 10 is a front view of the container of FIG. 2 having an opened interior space. Referring to FIG. 10, the support part 250 may support the sensor WS in the interior space. For example, among the support slots 252 of the support part 250, the support slot 252 located at the uppermost side may support the sensor WS.

Figure 11:
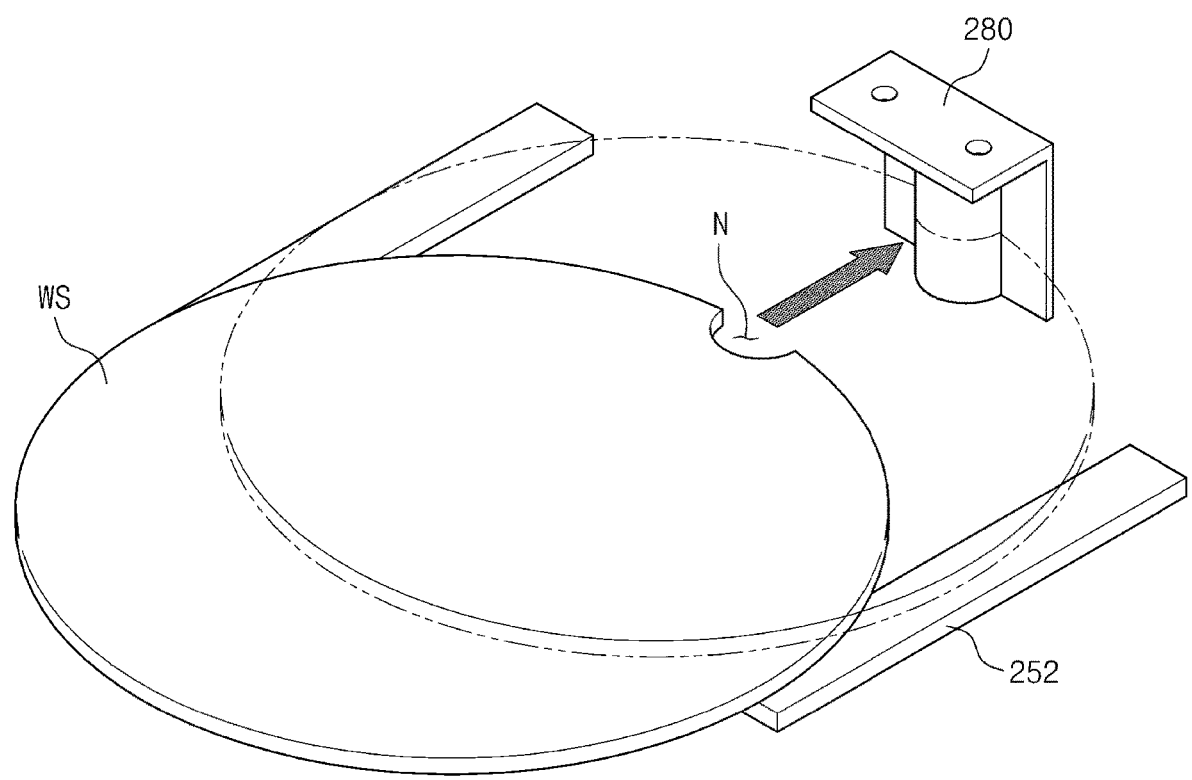
FIG. 11 is a view illustrating states of a notch aligning member of FIG. 10, and a sensor aligned by the notch aligning member.

Furthermore, the container 200 may further include the notch aligning member 280. The notch aligning member 280 may be installed on, among the inner wall surfaces of the housing 210, the inner wall surface that faces a surface, to which the door 240 is coupled. Furthermore, the notch aligning member 280 may be installed at a height that faces the height of the sensor WS seated in, among the support slots 252, the support slot 252 located on the uppermost side. Furthermore, as illustrated in FIG. 11, the notch aligning member 280 may include a block part having a shape corresponding to a notch "N" formed in the sensor WS. Accordingly, when the sensor WS is carried into the interior space of the container 200, the notch aligning member 280 may align the sensor WS having the notch "N". For example, the notch aligning member 280 may align the location and the direction of the sensor WS having the notch "N".

The sensor WS that may be carried into the container 200 may have a shape of a substrate. For example, the sensor WS may be a wafer type sensor. The sensor WS may be a tool that is transferred into the process chamber 370 to monitor a process performed in the process chamber 370. Furthermore, the sensor WS may collect information on the process performed in the process chamber 370, and states of substrates provided into the process chamber 370. Furthermore, the sensor WS may store the collected information, and may transmit the stored information to the controller 500 through a wireless communication method.

Referring to FIG. 1 again, the controller 500 may control the substrate treating apparatus 1000. The controller 500 may control the substrate treating apparatus 1000 such that the substrate treating apparatus 1000 performs a treatment process on the substrate. For example, the controller 500 may control the substrate treating apparatus 1000 such that the substrate may be carried out from the container 200, in which the substrate that requires a treatment is received, and the substrate carried out may be transferred to the process chamber 370. Furthermore, in order to monitor the process performed in the process chamber 370, the controller 500 may control the substrate treating apparatus 1000 such that the sensor WS is carried out from the container 200, in which the sensor WS is received, and the sensor WS carried out is transferred to the process chamber 370.

Furthermore, when a specific number of substrates are treated in the process chamber 370 or the shape of the expendable component "R" provided to the process chamber 370 is deformed in a range that deviates from an allowable range, the controller 500 may control the substrate treating apparatus 1000 to replace the expendable component "R" provided to the process chamber 370. For example, the controller 500 may control the second transfer robot 350 to carry out the used expendable component "R" from the process chamber 370. Further, the controller 500 may control the second transfer robot 350 to transfer the used expendable component "R" carried out from the process chamber 370, to the load lock chamber 310. For example, the controller 500 may control the first transfer robot 150 such that the first transfer robot 150 carries out the used expendable component "R" transferred to the load lock chamber 310. Further, the controller 500 may control the first transfer robot 150 to transfer the used expendable component "R" carried out from the load lock chamber 310, into the container 200. Further, the controller 500 may control the first transfer robot 150 to carry out the unused expendable component "R" from the container 200. Further, the controller 500 may control the first transfer robot 150 to transfer the unused expendable component "R" to the load lock chamber 310. Further, the controller 500 may control the second transfer robot 350 to transfer the unused expendable component "R" from the load lock chamber 310 to the process chamber 370.

Furthermore, the controller 500 may control the first transfer robot 150 and/or the second transfer robot 350 such that transfer speeds of the expendable component "R" and the substrate treated in the process chamber 370 are different from each other. For example, the controller 500 may control the first transfer robot 150 and/or the second transfer robot 350 such that transfer speed of the expendable component "R" is lower than the transfer speed of the substrate treated in the process chamber 370. When the expendable component "R" is transferred by the first transfer robot 150 and/or the second transfer robot 350, it may be transferred while being positioned on the carrier "C" supported by the hands of the first and second transfer robots 150 and 350. Then, when the transfer speed of the expendable component "R" is too high, the expendable component "R" may be slid from the carrier "C" or be separated from the carrier "C". Accordingly, the controller 500 according to the embodiment of the inventive concept may minimize the problems of the expendable component "R" being slid or separated from the carrier "C" while being transferred by making the transfer speed of the expendable component "R" lower than the transfer speed of the substrate.

Figure 12:
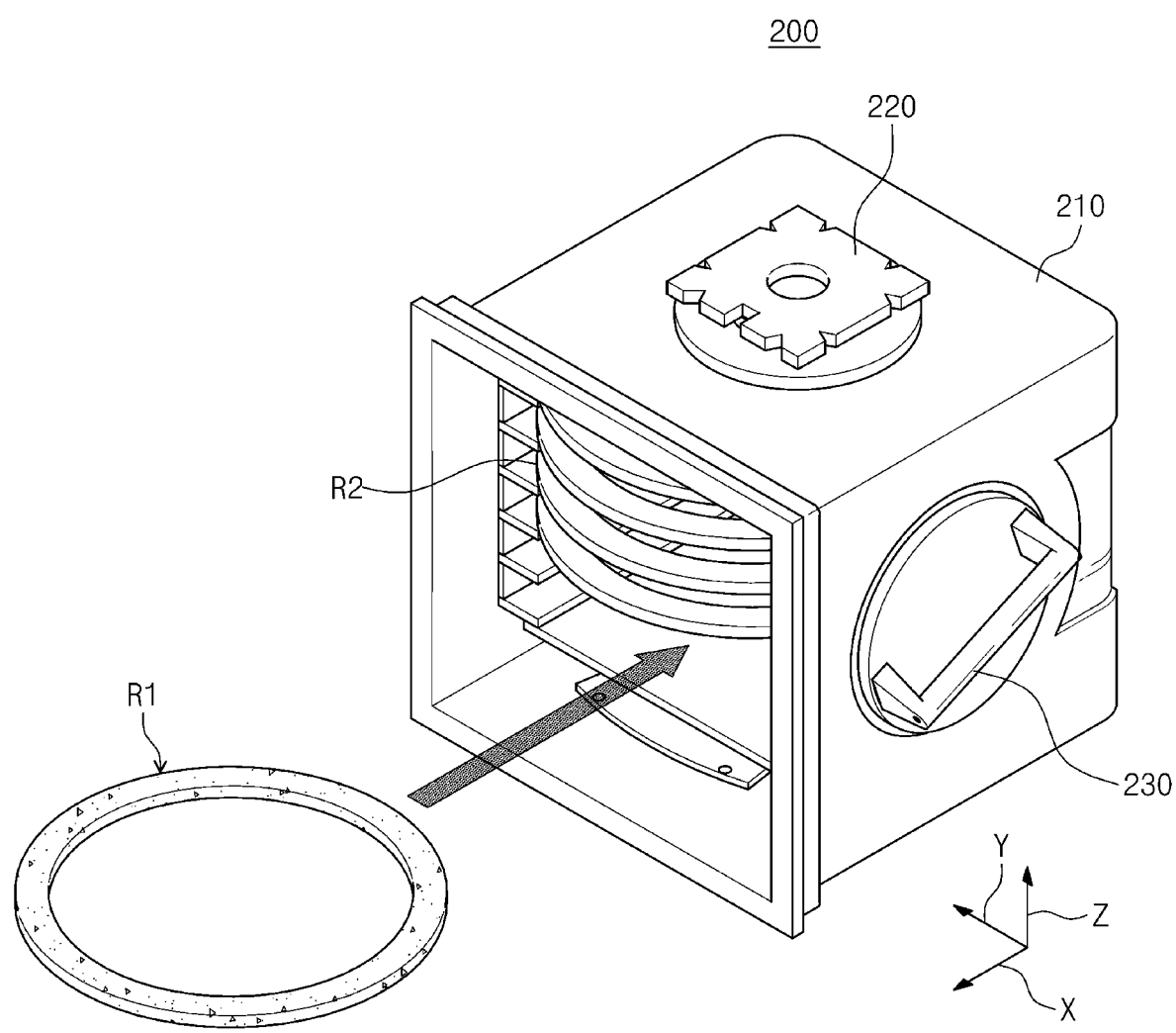
FIG. 12 is a view illustrating a state, in which an expendable component used in a process chamber is carried into the interior space of the container.

FIG. 12 is a view illustrating a state, in which an expendable component used in a process chamber is carried into the interior space of the container. Referring to FIG. 12, an expendable component R1 used in the process chamber may be transferred into the interior space of the container 200, in which a unused expendable component R2 is received. When the expendable component R1 used in the process chamber 370 is carried into the interior space of the container 200, the used expendable component "R" may be transferred to a location below the unused expendable component R2 received in the container 200. That is, the used expendable component R1 may be carried into the support slot 252 provided below the support slot 252 that supports the unused expendable component R2.

Impurities, particles, and the like generated in the process chamber 370 in the substrate treating process may be attached to the used expendable component R1, and the used expendable component R1 may be transferred to the location blow the unused expendable component R2 so that the impurities, the particles, and the like attached to the used expendable component "R" may be prevented from being attached to the unused expendable component R2.

Figure 13:
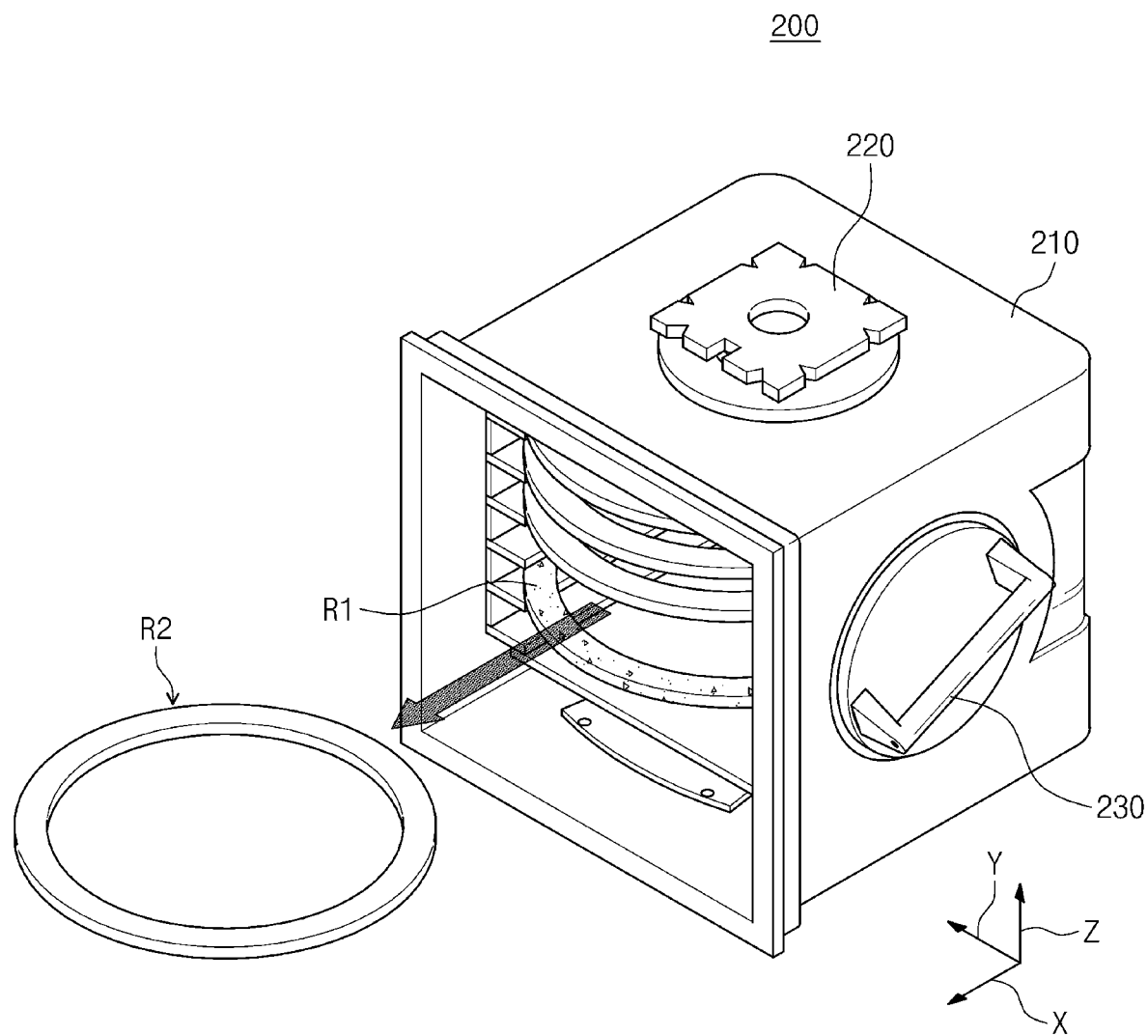
FIG. 13 is a view illustrating a state, in which an unused expendable component is carried out of the interior space of the container.

FIG. 13 is a view illustrating a state, in which an unused expendable component is carried out from the interior space of the container. Referring to FIG. 13, the unused expendable component R2 may be carried out from the interior space of the container 200 and be transferred to the process chamber 370.

Furthermore, the alignment block 260 may be installed only in, among the support slots 252, the support slot 252 that supports the unused expendable component R2. For example, the alignment block 260 may not be installed in the support slot 252 that supports the used expendable component R1. When the alignment block 260 is installed in the support slot 252 that supports the used expendable component R1, the first transfer robot 150 additionally requires an alignment operation of aligning the locations of the alignment groove "G" formed in the expendable component "R" and the alignment pin 264 of the alignment block 260. However, according to the embodiment of the inventive concept, the alignment block 260 is installed only in the support slot 252 that supports the unused expendable component R2. Accordingly, when the used expendable component R1 is carried into the container 200, because an alignment operation of aligning the location of the alignment groove "G" formed in the used expendable component R1 and the location of the alignment pin 264 is not additionally required, an operation of the first transfer robot 150 may be further simplified.

However, the inventive concept is not limited thereto, and the alignment blocks 260 may be installed on both the support slot 252 that supports the unused expendable component R2 and the support slot 252 that supports the used expendable component R1. The first transfer robot 150 may transfer the expendable component "R" into the interior space of the container 200 such that the locations of the alignment groove "G" formed in the expendable component "R" and the alignment pin 264 of the alignment block 260 correspond to each other. For example, the first transfer robot 150 may perform an alignment operation of aligning the locations of the alignment groove "G" of the expendable component "R" and the alignment pin 264 of the alignment block 260.

Furthermore, when the unused expendable component R2 is carried out from the container 200, among the unused expendable components R2 received in the container 200, the unused expendable component R2 located on the lowermost side may be carried out. Furthermore, the interior space, in which the unused expendable component R2 is seated, and the interior space, in which the used expendable component R1 is seated, may be common. That is, when the unused expendable component R2 is carried out from the interior space of the container 200, among the unused expendable component R2, the unused expendable component R2 located on the lowermost side is carried out, and the interior space, in which the unused expendable component R2 is seated, and the interior space, in which the used expendable component R2 is seated, are common, so that the used expendable component R1 also may be carried into the support slot 252, in which the unused expendable component R2 has been seated. Accordingly, when the unused expendable components R2 received in the container are all carried out, the used expendable components R1 may be seated in all of the supports slots 252 of the container 200, so that the reception compatibility of the container 200 may be secured.

FIGS. 4, 7, and 8, which have been described above, illustrate as an example that the shape of the alignment pins 264 have cylindrical shapes, but the inventive concept is not limited thereto.

Figure 14:
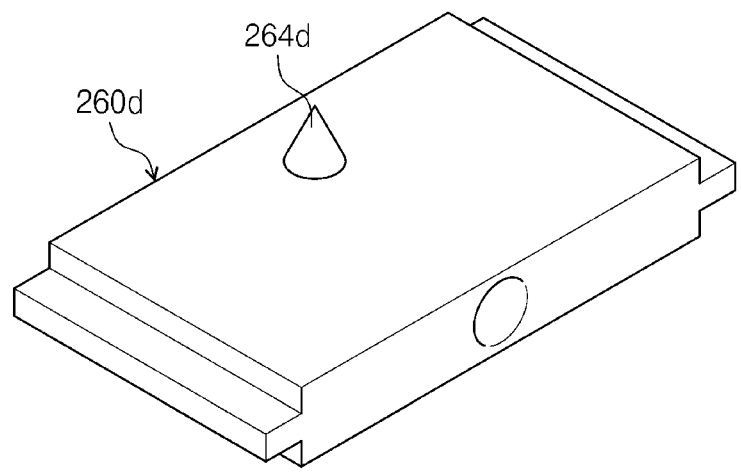
FIG. 14 is a view illustrating another example of the alignment block.
Figure 15:
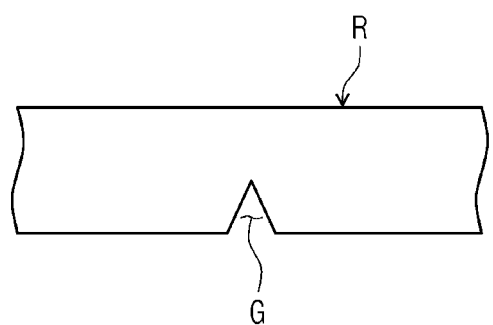
FIG. 15 is a view illustrating an expendable component having an alignment groove, in which an alignment pin of FIG. 14 is inserted.

For example, as illustrated in FIG. 14, an alignment pin 264*d* provided to an alignment block 260*d* ma have a conical shape. In this case, the shape of the alignment groove "G" formed in the expendable component "R", as illustrated in FIG. 5, also may have a conical shape corresponding to that of the alignment pin 264*d*.

Figure 16:
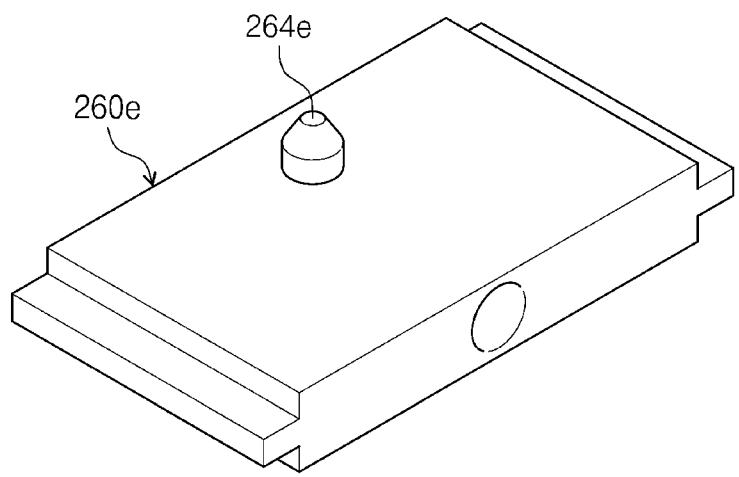
FIG. 16 is a view illustrating another example of the alignment block.
Figure 17:
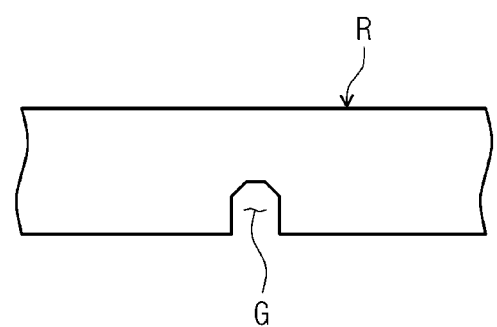
FIG. 17 is a view illustrating an expendable component having an alignment groove, in which an alignment pin of FIG. 16 is inserted.

Unlike this, as illustrated in FIG. 16, a shape of an alignment pin 264*e* provided in an alignment block 260*e* may have a cylindrical lower portion and a truncated conical upper portion. In this case, the shape of the alignment groove "G" formed in the expendable component "R", as illustrated in FIG. 17, also may have the cylindrical lower portion and the truncated conical upper portion such that the shape of the alignment groove "G" corresponds to the alignment pin 264*d*.

Figure 18:
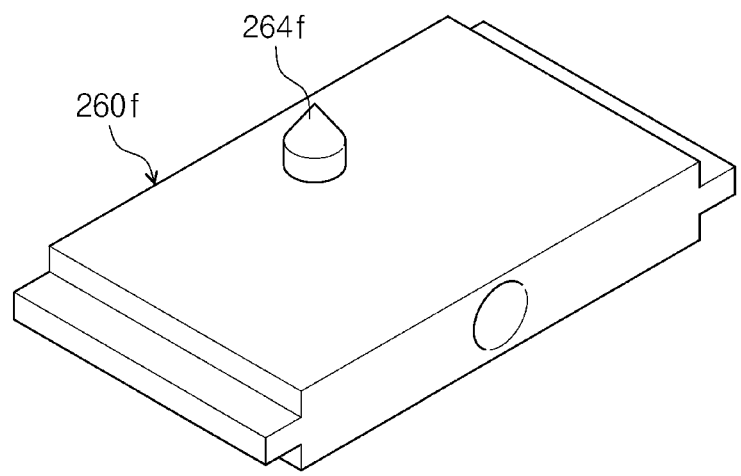
FIG. 18 is a view illustrating another example of the alignment block.

Unlike this, as illustrated in FIG. 18, a shape of an alignment pin 264*f* provided in an alignment block 260*f* may have a cylindrical lower portion and a conical upper portion.

Figure 19:
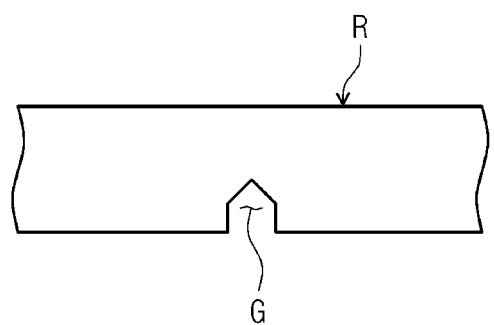
FIG. 19 is a view illustrating an expendable component having an alignment groove, in which an alignment pin of FIG. 18 is inserted.

In this case, the shape of the alignment groove "G" formed in the expendable component "R", as illustrated in FIG. 19, also may have the cylindrical lower portion and the conical upper portion such that the shape of the alignment groove "G" corresponds to the alignment pin 264*f*.

Figure 20:
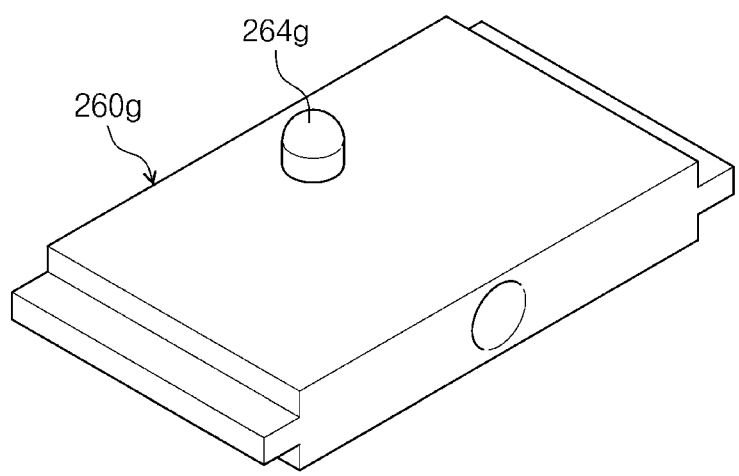
FIG. 20 is a view illustrating another example of the alignment block.
Figure 21:
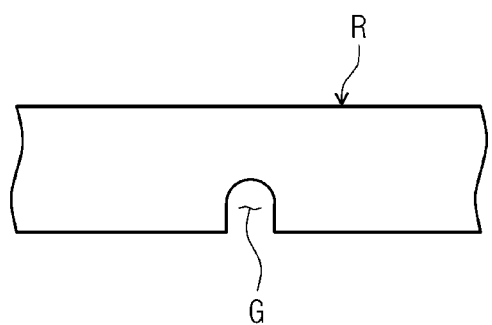
FIG. 21 is a view illustrating an expendable component having an alignment groove, in which an alignment pin of FIG. 20 is inserted.

Unlike this, as illustrated in FIG. 20, a shape of an alignment pin 264*g* provided in an alignment block 260*g* may have a cylindrical lower portion and a truncated spherical upper portion. In this case, the shape of the alignment groove "G" formed in the expendable component "R", as illustrated in FIG. 21, may have the cylindrical lower portion and the truncated spherical upper portion such that the shape of the alignment groove "G" corresponds to the alignment pin 264*g*.

Figure 22:
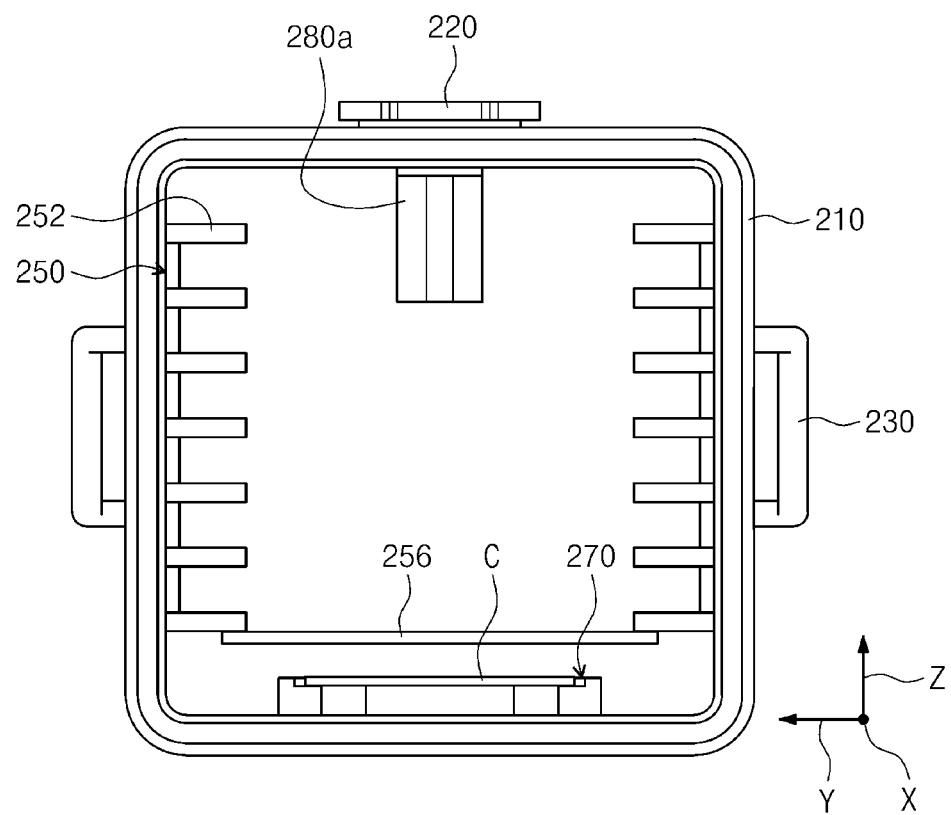
FIG. 22 is a view illustrating another example of the notch aligning member.

In the above-described example, it has been described as an example that the sensor WS is seated, among the support slots 252, the support slot 252 located on the uppermost side, but the inventive concept is not limited thereto. For example, as illustrated in FIG. 22, a plurality of support slots 252 may be provided to support the sensor WS. In this case, an upward/downward length of a notch aligning member 280*a* may be larger than that of the notch aligning member 280 illustrated in FIG. 10. For example, the notch aligning member 280*a* may have a length, by which the notches "N" of the sensors WS seated in at least two support slots 252 may be aligned.

Figure 23:
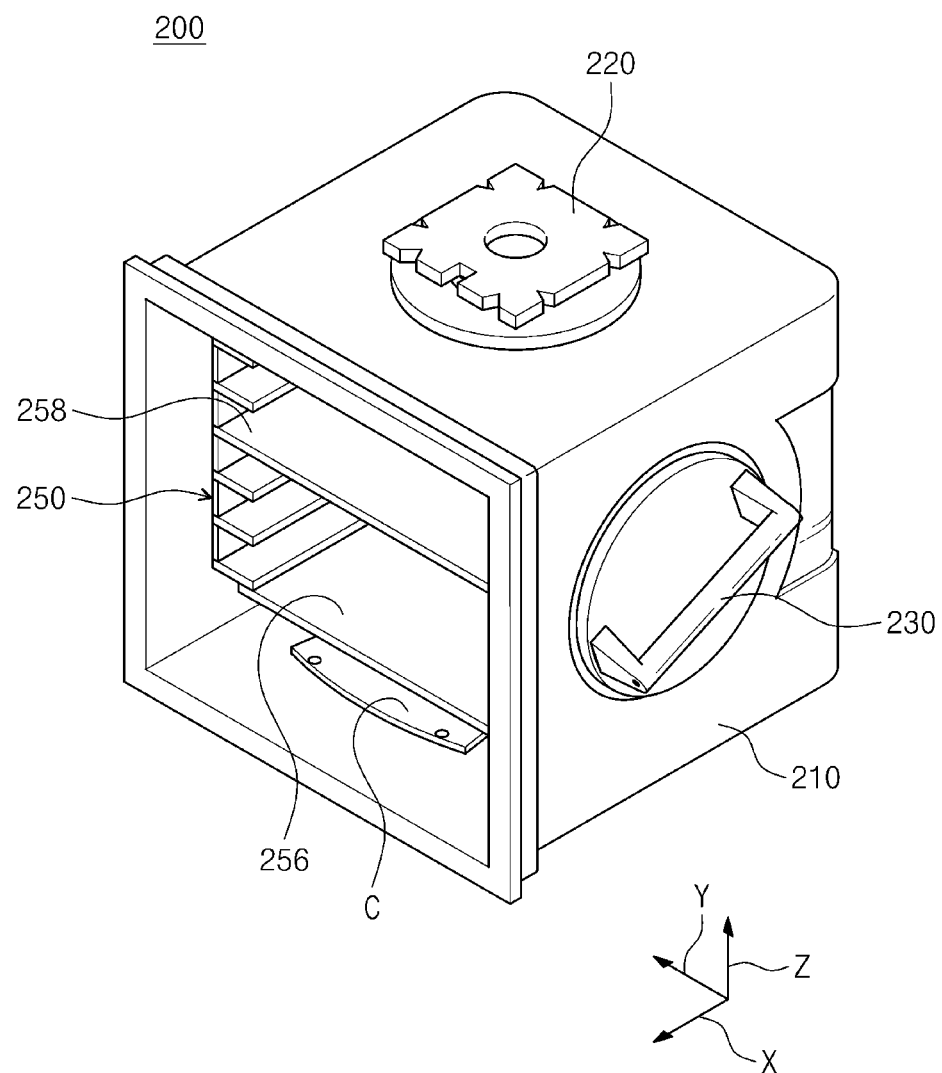
FIGS. 23 and 24 are views illustrating a container according to another embodiment of the inventive concept.
Figure 24:
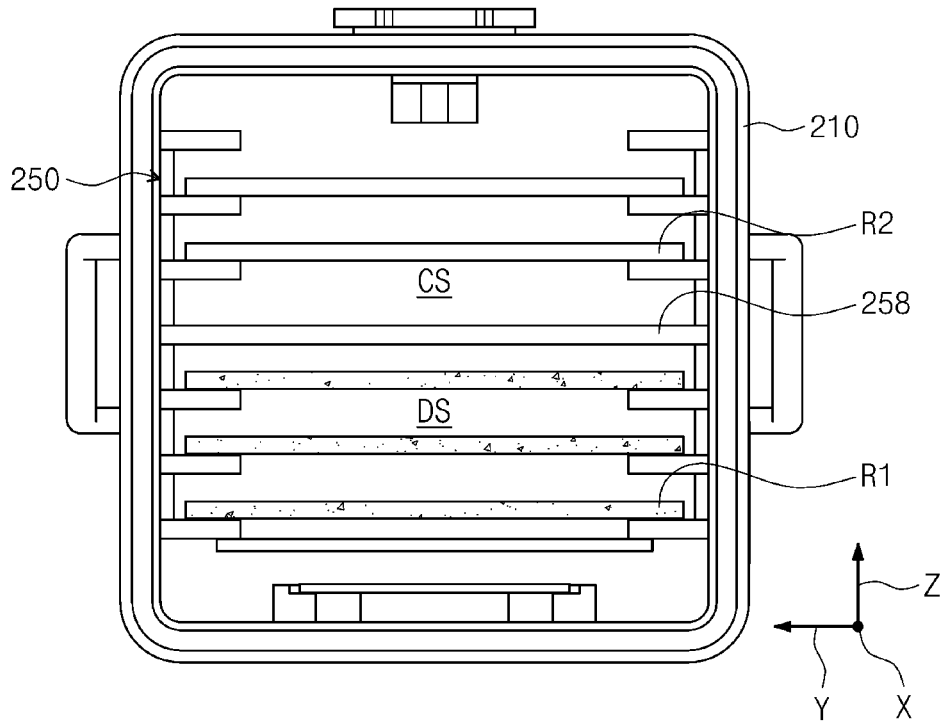

In the above-described example, it has been described as an example that the space, in which the used expendable component R1 is received, and the space, in which the unused expendable component R2 is received, is common, but the inventive concept is not limited thereto. For example, as illustrated in FIGS. 23 and 24, the support part 250 of the container 200 according to another embodiment of the inventive concept may further include a partition plate 258. The partition plate 258 may partition the interior space of the housing 210. For example, the partition plate 258 may partition the interior space of the housing 210 into an upper space and a lower space. The upper space CS partitioned by the partition plate 258 may be a space, in which at least one of the unused expendable component R2 and the used expendable component R1 is received. For example, the upper space CS may be a space, in which the unused expendable component R2 is received. Furthermore, the lower space DS partitioned by the partition plate 258 may be a space, in which the other one of the unused expendable component R2 and the used expendable component R1 is received. For example, the lower space DS may be a space, in which the used expendable component R1 is received. Because the space, in which the used expendable component R1 is received, and the space, in which the unused expendable component R2 is received, are separated by the partition plate 258, the impurities attached to the used expendable component R1 may be minimized from being delivered to the unused expendable component R2. Furthermore, the alignment block 260 may be installed in the support slot 252 of the upper space CS, and the alignment block 260 may not be installed in the support slot 252 of the lower space DS. However, the inventive concept is not limited thereto, and the alignment blocks 260 may be installed on both the support slots 252 of the upper space CS and the lower space DS.

Figure 25:
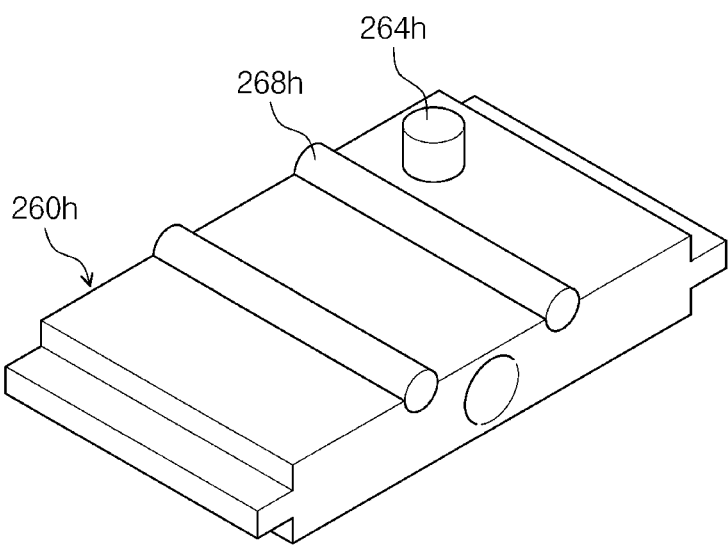
FIG. 25 is a view illustrating an alignment block according to another embodiment of the inventive concept.

It has been described as an example that the alignment pin 264 is formed in the alignment block 260, but the inventive concept is not limited thereto. For example, as illustrated in FIG. 25, an alignment pin 264*h* may be formed in an alignment block 260*h*. Furthermore, a contact pad 268*h* that contacts a bottom surface of the expendable component "R"

may be provided on an upper surface of the alignment block 260*h*. The contact pad 268*h* may be formed of a material having an anti-frictional property to the expendable component. For example, the contact pad 268*h* may be formed of polyetheretherketone (PEEK) filled with carbon. However, the embodiment, in which the PEEK filled with carbon is used as the material of the contact pad 268*h*, is merely an example, and various modifications may be made with other known materials having similar properties.

Figure 26:
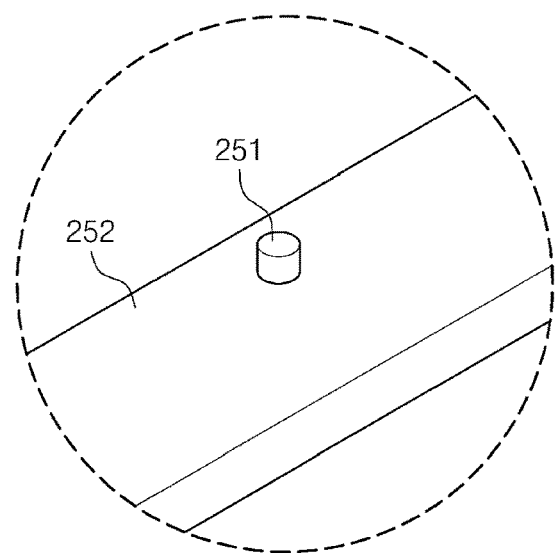
FIG. 26 is a view illustrating a support slot according to another embodiment of the inventive concept.

It has been described as an example that the support part 250 has the support slot 252 and the alignment block 260 inserted into the support slot 252 has the alignment pin 264, but the inventive concept is not limited thereto. For example, as illustrated in FIG. 26, an alignment pin 251 may be formed in the support slot 252 itself.

Figure 27:
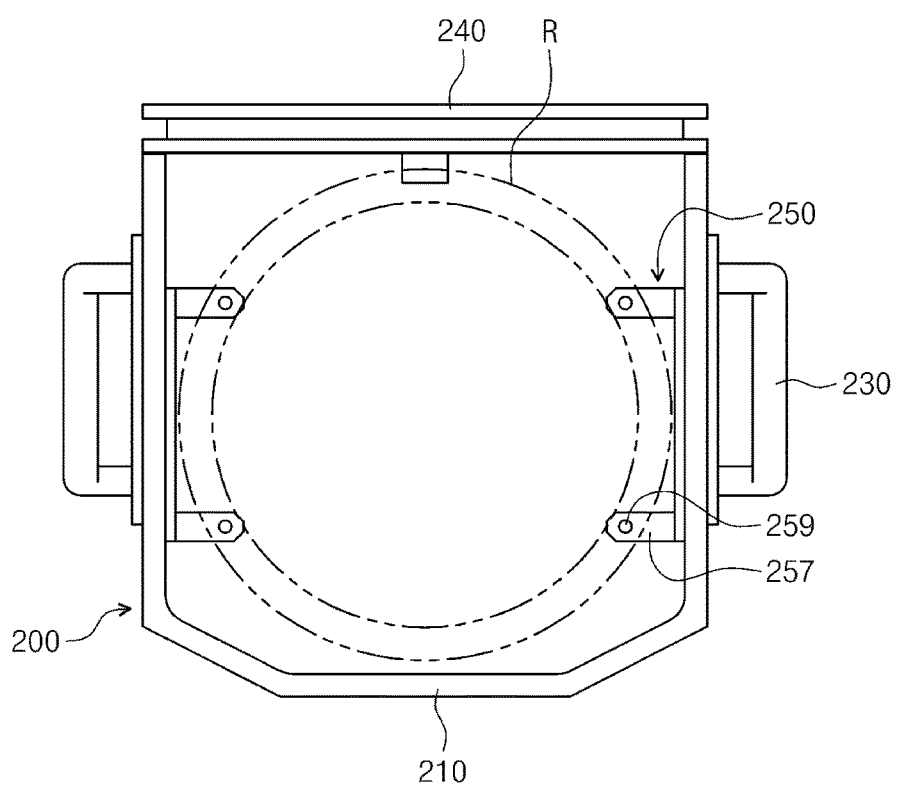
FIG. 27 is a view illustrating a support part of a container according to another embodiment of the inventive concept.
Figure 28:
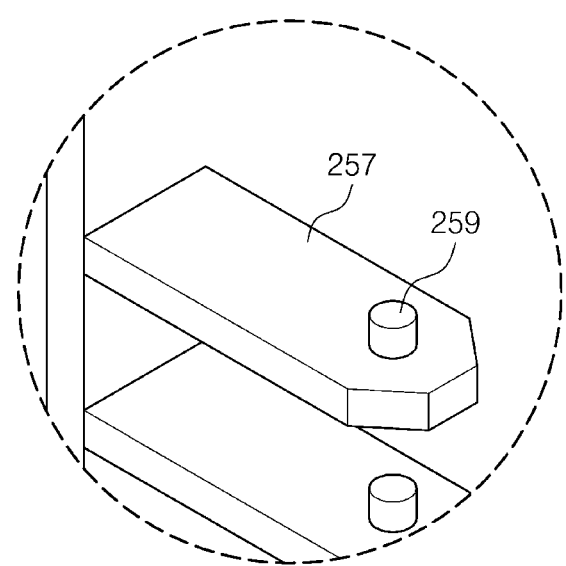
FIG. 28 is a view illustrating a support finger of FIG. 27.

It has been described in the above-described example that the support slot 252 has a bar shape, but the inventive concept is not limited thereto. For example, as illustrated in FIGS. 27 and 28, the support part 250 may include a support slot 257 having a finger shape. When viewed from the top, a plurality of support slots 257 having the finger shape may be provided. The plurality of support slots 257 having the finger shape may support the bottom surface of the expendable component "R" at different locations. Furthermore, the support slot 257 having the finger shape may be provided with an alignment pin 259 that aligns the location of the supported expendable component "R".

According to the embodiments of the inventive concept, a location of an expendable component received in the container may be aligned.

Furthermore, according to the embodiments of the inventive concept, a location of a sensor received in the container may be aligned.

Furthermore, according to the embodiments of the inventive concept, an expendable component may be allowed to be seated at a proper location in the process chamber when the expendable component received in the container is transferred to the process chamber, Furthermore, according to the embodiments of the inventive concept, a sensor may be allowed to be seated at a proper location in the process chamber when the sensor received in the container is transferred to the process chamber, Furthermore, according to the embodiments of the inventive concept, when a used expendable component is carried into the container, impurities attached to the used expendable component are minimized from being delivered to an unused expendable component.

Furthermore, according to the embodiments of the inventive concept, locations of expendable components of various sizes may be aligned.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A container comprising:
a housing having an interior space; and
a support part configured to directly support an expendable component in the interior space,
wherein the support part includes:
an alignment pin configured to align the expendable component;
at least one support slot; and
an alignment block installed in the support slot to be detachable, and having the alignment pin;
wherein the alignment block has a protrusion formed on at least any one of surfaces contacting the support slot and guiding insertion of the alignment block at the at least any one of surfaces contacting the support slot, so that an upper surface and a lower surface of the alignment block with respect to an insertion direction are exposed.

2. The container of claim 1, wherein the support part further includes:
at least one guide pin configured to guide a location of the alignment block inserted into the support slot.

3. The container of claim 1, wherein at least one of surfaces of the support slot, which contacts the alignment block, has a shape corresponding to the protrusion.

4. The container of claim 1, wherein any one selected from a first alignment block, and a second alignment block, of which a location of the alignment pin is different from that of the first alignment block, is installed in the support slot.

5. The container of claim 1, wherein the alignment pin is inserted into a groove formed in the expendable component.

6. The container of claim 5, wherein the expendable component has a ring shape.

7. The container of claim 1, wherein the support part supports a substrate type sensor having a notch, in the interior space, and
wherein the container further includes a notch aligning member inserted into the notch and configured to align the sensor.

8. The container of claim 1, further comprising:
a partition plate configured to partition the interior space into a space, in which an unused expendable component is received, and a space, in which a used expendable component is received.

9. A substrate treating apparatus comprising:
a process chamber configured to perform a treatment process;
a load pot configured to receive an expendable component of the process chamber and in which a container having an interior space is seated; and
a transfer robot configured to transfer the expendable component between the process chamber and the container,
wherein the container includes:
a support part having: a plurality of support slots that directly support the expendable component; and an alignment block detachably mounted on the support slot and provided with an alignment pin inserted into a groove formed in the expendable component;

wherein the alignment block has a protrusion formed on at least any one of surfaces contacting the support slot and guiding insertion of the alignment block at the at least any one of surfaces contacting the support slot, so that an upper surface and a lower surface of the alignment block with respect to an insertion direction are exposed.

10. The substrate treating apparatus of claim 9, further comprising:
a controller,
wherein the controller controls the transfer robot such that the transfer robot transfers the expendable component used in the process chamber to the interior space and transfers an unused expendable component in the interior space to the process chamber.

11. The substrate treating apparatus of claim 9, wherein a controller controls the transfer robot such that a transfer speed of the expendable component is lower than a transfer speed of a substrate.

12. The substrate treating apparatus of claim 9, further comprising:
a partition plate configured to partition the interior space into a space, in which an unused expendable component is received, and a space, in which a used expendable component is received.

13. The substrate treating apparatus of claim 12, wherein the alignment block is installed in the support slot of the space, in which the unused expendable component is received.

14. The substrate treating apparatus of claim 9, further comprising:
a groove, into which the alignment pin is inserted, is formed on a bottom surface of the expendable component.

15. A substrate treating apparatus comprising:
a process chamber configured to treat a substrate by using plasma;
a load pot, in which a container that receives a focusing ring provided in the process chamber is seated; and
a transfer robot configured to transfer the focusing ring between the process chamber and the container,
wherein the container includes:
a support part having: a plurality of support slots that directly support the focusing ring; and an alignment block detachably mounted on the support slot and provided with an alignment pin inserted into a groove formed in the focusing ring;
wherein the alignment block has a protrusion formed on at least any one of surfaces contacting the support slot and guiding insertion of the alignment block at the at least any one of surfaces contacting the support slot, so that an upper surface and a lower surface of the alignment block with respect to an insertion direction are exposed.

16. The substrate treating apparatus of claim 15, wherein the support part includes:
a plurality of guide pins configured to guide a location of the alignment block inserted into the support slot.

17. The substrate treating apparatus of claim 16, wherein the container further includes:
a notch aligning member inserted into a notch formed in a substrate type sensor received in the container, and configured to align the substrate type sensor.

18. The substrate treating apparatus of claim 15, further comprising:
a controller,
wherein the controller controls the transfer robot such that the transfer robot transfers the focusing ring that has been used in the process chamber to the container, and transfers the used focusing ring that is transferred to the container to a location below an unused focusing ring seated in the container.

* * * * *